(12) United States Patent
Alsmeier et al.

(10) Patent No.: US 8,455,939 B2
(45) Date of Patent: Jun. 4, 2013

(54) STACKED METAL FIN CELL

(75) Inventors: Johann Alsmeier, San Jose, CA (US);
Vinod Purayath, Santa Clara, CA (US);
James Kai, Santa Clara, CA (US);
George Matamis, San Jose, CA (US)

(73) Assignee: SanDisk Technologies Inc., Plano, TX (US)

( * ) Notice: Subject to any disclaimer, the term of this patent is extended or adjusted under 35 U.S.C. 154(b) by 174 days.

(21) Appl. No.: 12/974,235

(22) Filed: Dec. 21, 2010

(65) Prior Publication Data

US 2012/0153376 A1    Jun. 21, 2012

(51) Int. Cl.
*H01L 29/788*    (2006.01)
*H01L 21/336*    (2006.01)

(52) U.S. Cl.
USPC ........... 257/316; 257/319; 257/314; 257/315; 257/E21.422; 257/E21.09; 438/129; 438/128; 438/424; 438/264

(58) Field of Classification Search
USPC ......... 257/316, 319, E21.422, E29.3, E21.09, 257/314, 315; 438/128, 129, 424, 264
See application file for complete search history.

(56) References Cited

U.S. PATENT DOCUMENTS

| | | | |
|---|---|---|---|
| 5,166,902 A | 11/1992 | Silver | |
| 2008/0035983 A1 | 2/2008 | Sandhu et al. | |
| 2008/0076217 A1 | 3/2008 | Chien et al. | |
| 2008/0291728 A1* | 11/2008 | Terzioglu et al. | 365/185.08 |
| 2009/0147576 A1 | 6/2009 | Matamis et al. | |
| 2012/0147676 A1* | 6/2012 | Mokhlesi et al. | 365/185.17 |
| 2012/0199987 A1* | 8/2012 | Sinha et al. | 257/777 |

FOREIGN PATENT DOCUMENTS

WO    2010/005878 A1    1/2010

OTHER PUBLICATIONS

International Search Report & Written Opinion issued in PCT Application No. PCT/US2011/065472, mailed on Jun. 27, 2012.
U.S. Appl. No. 12/827,947, filed Jun. 30, 2010 (50 pages).
U.S. Appl. No. 12/827,577, filed Jun. 30, 2010 (48 pages).
U.S. Appl. No. 12/827,869, filed Jun. 30, 2010 (50 pages).
U.S. Appl. No. 12/827,761, filed Jun. 30, 2010 (52 pages).
U.S. Appl. No. 12/848,458, filed Aug. 2, 2010(28 pages).

* cited by examiner

*Primary Examiner* — Cathy N Lam
(74) *Attorney, Agent, or Firm* — The Marbury Law Group PLLC

(57) ABSTRACT

A NAND device including a source, a drain and a channel located between the source and drain. The NAND device also includes a plurality of floating gates located over the channel and a plurality of electrically conducting fins. Each of the plurality of electrically conducting fins is located over one of the plurality of floating gates. The plurality of electrically conducting fins include a material other than polysilicon. The NAND device also includes a plurality of control gates. Each of the plurality of control gates is located adjacent to each of the plurality of floating gates and each of the plurality of electrically conducting fins.

6 Claims, 9 Drawing Sheets

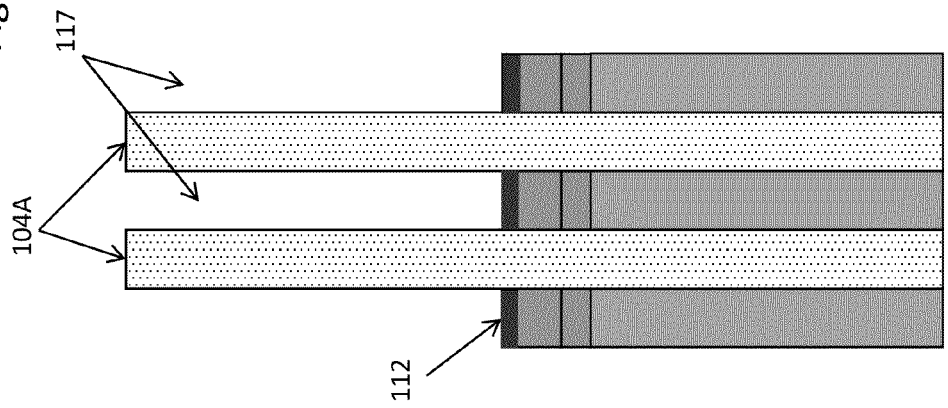
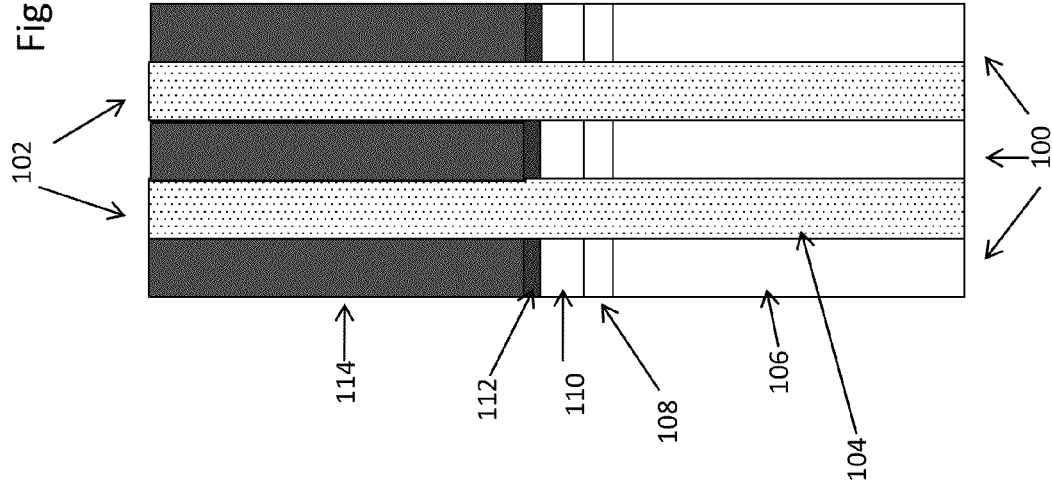

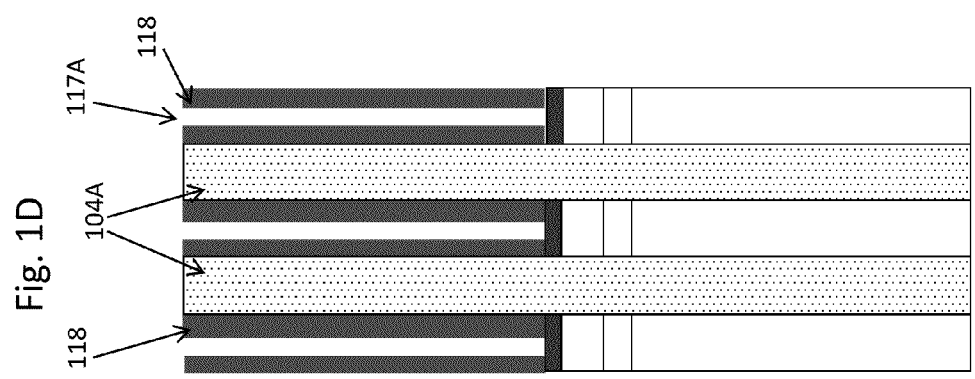
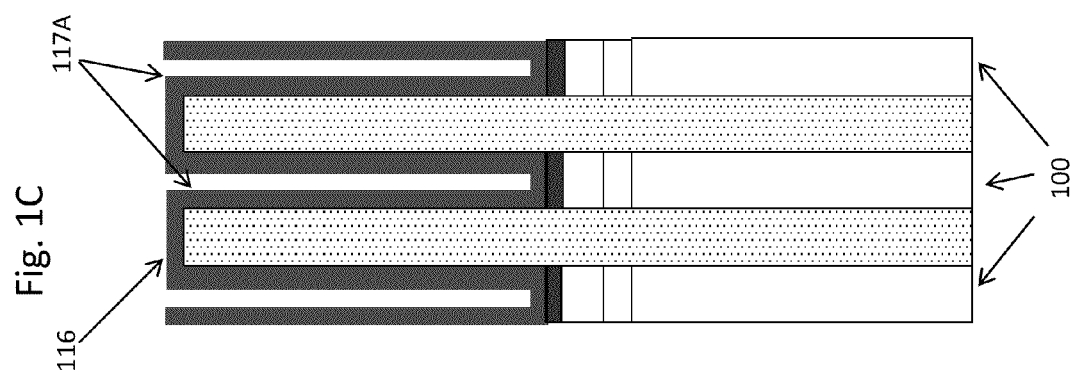

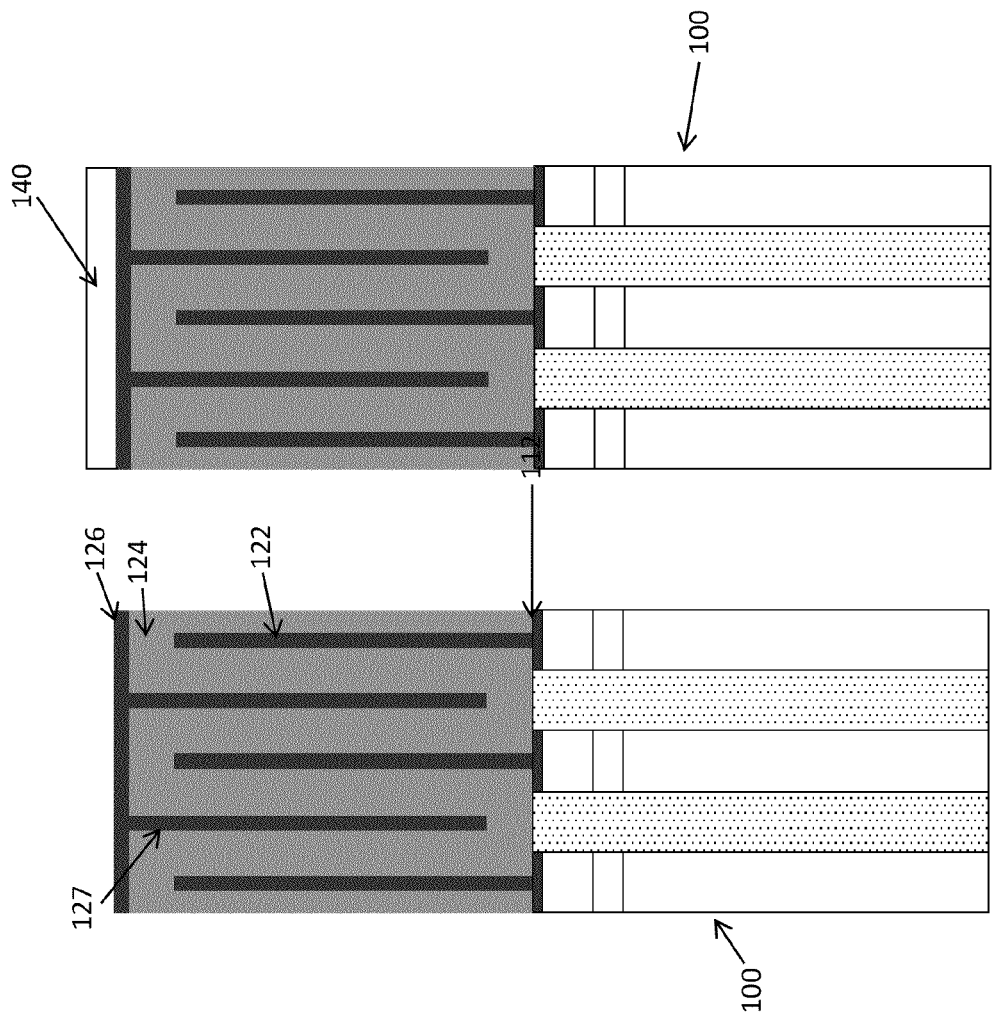

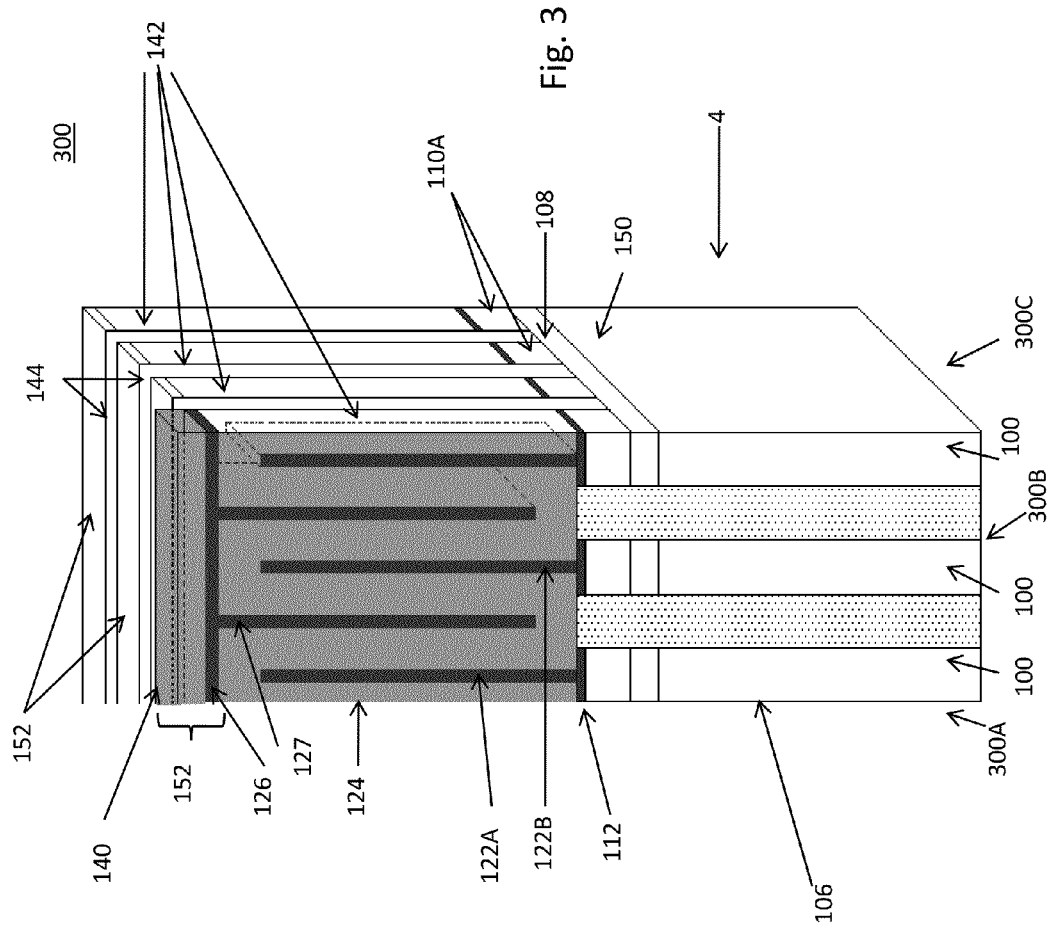

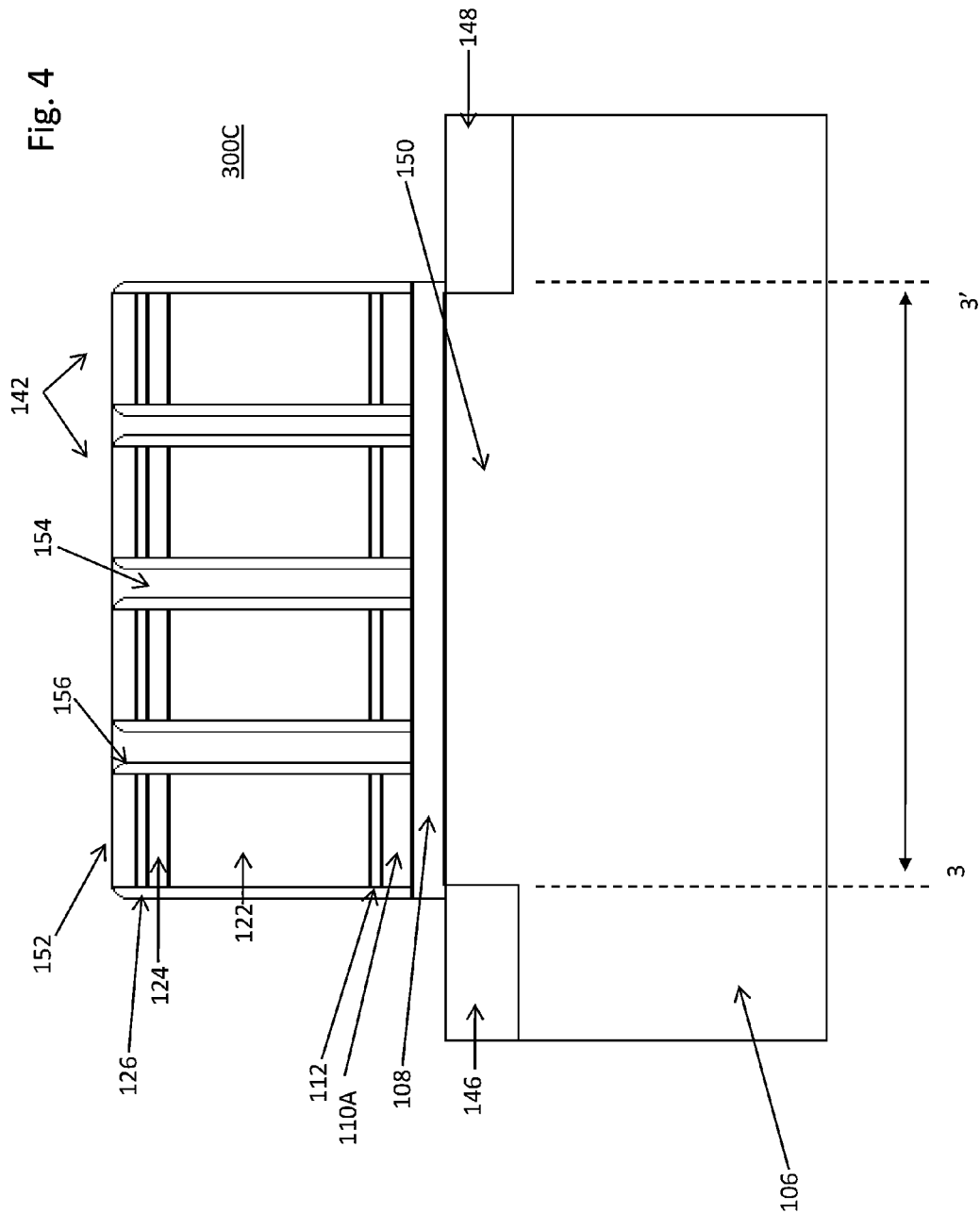

STACKED METAL FIN CELL

FIELD

The present invention is directed to non-volatile memory cells, more particularly to NAND devices with stacked electrically conducting fins.

BACKGROUND

Non-volatile memory cells include a floating gate in which electric charge may be injected. As implied by the name, the floating gate electrically "floats" with regard to other structures in the cell such that the injected charge is retained even if the memory cell is powered down. Scaling of a 2D NAND flash cell, especially in the word line direction, is limited by doped poly depletion due to the very small feature sizes.

SUMMARY

An embodiment relates to a NAND device including a source, a drain and a channel located between the source and drain. The NAND device also includes a plurality of floating gates located over the channel and a plurality of electrically conducting fins. Each of the plurality of electrically conducting fins is located over one of the plurality of floating gates. The plurality of electrically conducting fins include a material other than polysilicon. The NAND device also includes a plurality of control gates. Each of the plurality of control gates is located adjacent to each of the plurality of floating gates and each of the plurality of electrically conducting fins.

Another embodiment relates to a method of making a NAND device. The method includes providing a plurality of first rails separated by first gaps filled with an insulating fill layer. The first rails include a semiconductor active layer, a tunneling dielectric layer over the semiconductor active layer, a floating gate layer over the tunneling dielectric layer, and a sacrificial layer over the floating gate layer. The method also includes removing at least a portion of the sacrificial layer of the first rails and forming a first electrically conducting layer over the first rails. At least a portion of the first electrically conducting layer has a minor surface parallel to a minor surface of the first rails and a major surface perpendicular to the minor surface of the first rails and a width of the minor surface of the electrically conducting layer is approximately one half or less than a width of the minor surface of the first rails.

Another embodiment, relates to a method of making a NAND device. The method includes providing a plurality of first rails separated by first gaps filled with an insulating fill layer. The first rails includes a semiconductor active layer, a tunneling dielectric layer over the semiconductor active layer, a floating gate layer over the tunneling dielectric layer, a second electrically conducting layer over the floating gate layer and a sacrificial layer over the a second electrically conducting layer. The insulating fill material fills the first gaps to a level approximately equal to a top of the sacrificial layer. The method also includes removing the sacrificial layer, thereby forming insulating fill rails separated by second gaps, such that the second electrically conducting layer in the first rails is exposed in the second gaps. The method also includes depositing a spacer layer over the insulating fill rails, patterning the spacer layer to form sidewall spacers on the insulating fill rails, such that the sidewall spacers reduce a width of the second gaps and forming a first electrically conducting layer in the second gaps after the step of forming the sidewall spacers to form a plurality of electrically conducting fins. Each of the plurality of electrically conducting fins is located in one of the respective second gaps. The method also includes removing the insulating fill rails and the sidewall spacers, thereby leaving the plurality of electrically conducting fins spaced apart from each other by third gaps. The method further includes forming a conformal blocking dielectric layer over the plurality of electrically conducting fins, such that the blocking dielectric layer partially fills the third gaps and forming a third electrically conducting layer over the blocking dielectric layer. Portions of the third electrically conducting layer fill a remaining space in the partially filled third gaps, the portions of the third electrically conducting layer form strip shaped portions of at least one control gate, such that each pair of adjacent fins is interdigitated with one of the strip shaped portions of at least one control gate.

Another embodiment relates to a method of making a NAND device. The method includes providing a plurality of first rails separated by first gaps filled with an insulating fill layer. The first rails includes a semiconductor active layer, a tunneling dielectric layer over the semiconductor active layer, a floating gate layer over the tunneling dielectric layer, a second electrically conducting layer over the floating gate layer, and a sacrificial layer over the a second electrically conducting layer. The insulating fill material includes a first fill material and a second fill material. The first fill material fills the first gaps to a level approximately equal to the bottom of the sacrificial layer. The second fill material is different from the first fill material. The second fill material is located over the first fill material and the second fill material fills the first gaps to a level approximately equal to the top of the sacrificial layer. The method includes removing the second fill material from every other first gap to form second gaps having the first fill material exposed on their bottom and selectively recess etching the sacrificial layer, thereby widening the second gaps and lowering a height of the sacrificial layer below a height of the second fill material remaining in the every other first gap. The method also includes forming a first electrically conducting layer in the second gaps on exposed sidewalls of the sacrificial layer, on top of the sacrificial layer adjacent to the second gaps, and on top and on exposed portions of the sidewalls of the second insulating fill material and performing a sidewall spacer etch of the first electrically conducting layer to form electrically conducting fin shaped spacers on the sacrificial layer. The method also includes selectively removing the second insulating fill material remaining in every other first gap and the sacrificial layer to leave a plurality of electrically conducting fins over the second electrically conducting layer spaced apart from each other by third gaps and forming a conformal blocking dielectric layer over the plurality of electrically conducting fins, such that the blocking dielectric layer partially fills the third gaps. The method further includes forming a third electrically conducting layer over the blocking dielectric layer. Portions of the third electrically conducting layer fill a remaining space in the partially filled third gaps, and portions of the third electrically conducting layer form strip shaped portions of at least one control gate, such that each pair of adjacent fins is interdigitated with one of the strip shaped portions of at least one control gate.

BRIEF DESCRIPTION OF THE DRAWINGS

FIGS. 1A-1H illustrate side cross sectional views of steps in a first embodiment of a method of making stacked metal fin cell.

FIGS. 2A-2H illustrate side cross sectional views of steps in a second embodiment of a method of making stacked metal fin cell.

FIGS. 3 and 4 illustrate respective three dimensional cut away view and side cross sectional view of a NAND device made by the methods of the first or second embodiments.

DETAILED DESCRIPTION

Figure 1F:
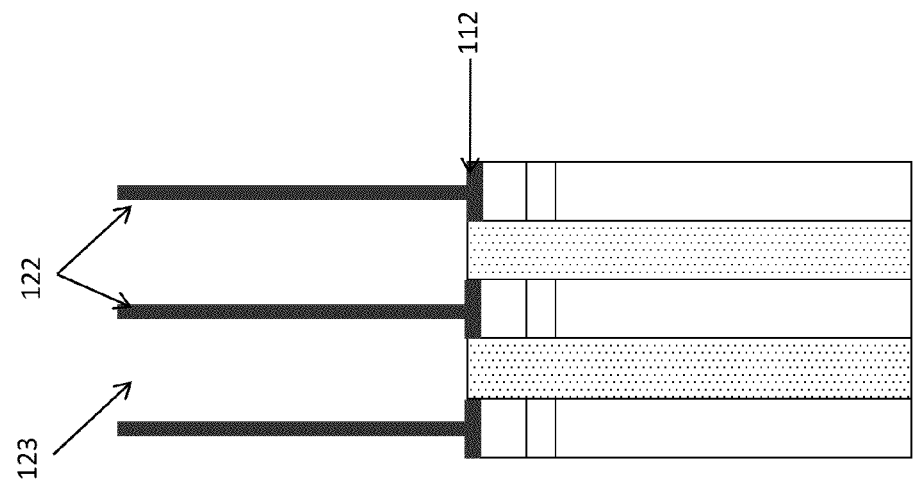

Theoretically, the use of tall floating gates interdigitated with the control gate could allow for smaller NAND flash cells. However, forming of tall floating gates by slimming polysilicon floating gates is difficult. It would therefore be advantageous to have a method of forming tall floating gates that does not use polysilicon slimming FIGS. 1A-1H illustrate side cross sectional views of steps in a first embodiment of a method of making stacked metal fin cell, such as a cell usable for a memory device, for example a NAND nonvolatile memory device. As illustrated in FIG. 1A, this method includes a step of providing first rails 100 separated by first gaps 102 filled with a first insulating fill layer 104. Rails 100 extend in and out of the page in FIG. 1A. The insulating fill layer 104 located in the first gaps 102 may comprise any suitable insulating material, such as silicon oxide, silicon nitride, BSG, BPSG, PSZ (Polysilizane), organic material, such as a polymer material, etc.

The first rails 100 include a semiconductor active layer 106, a tunneling dielectric layer 108 over the semiconductor active layer 106, a semiconductor (e.g., polysilicon) or an electrically conductive material, such as a metal or metal alloy (e.g., TiN, TaN, TaCN, WN, etc.) floating gate layer 110 over the tunneling dielectric layer 108, and a sacrificial layer 114 over the floating gate layer 110. An optional electrically conducting layer 112 may be located between layers 110 and 114 by being deposited over the floating gate layer 110 prior to depositing the sacrificial layer 114.

The semiconductor active layer 106 may comprise any semiconductor material, such any Group IV material, such as silicon, germanium, silicon germanium, silicon carbide, any III-V material, such as gallium arsenide or gallium nitride, or any II-VI material, such as zinc selenide or cadmium telluride. The active layer 106 may comprise a portion of a semiconductor substrate, such as a silicon wafer or substrate, or it may comprise a semiconductor layer, such as a silicon layer (e.g., single crystal silicon, polysilicon or amorphous silicon) located over a substrate, such as a semiconductor substrate (e.g., silicon wafer), an insulating substrate (e.g., glass, quartz or silicon on insulator type substrate) or a conductive substrate, such as a metal substrate.

The tunneling dielectric layer 108 may comprise any one or more insulating layers, such as silicon oxide, silicon nitride, silicon oxynitride, zirconium oxide, aluminum oxide, hafnium oxide, etc. The floating gate layer 110 preferably comprises a semiconductor layer, such as a polysilicon layer or a metal layer or metal alloy (e.g., TiN, TaN, TaCN, WN, etc.). The electrically conducting layer 112 may comprise any suitable conducting material, such as titanium nitride ("TiN"), tantalum nitride ("TaN"), tantalum carbonitride ("TaCN"), tungsten nitride ("WN") or ruthenium ("Ru") or other hard conductive materials. Layer 112 may be omitted if the floating gate layer 110 comprises a metal or metal alloy material. In the following discussion, an exemplary polysilicon floating gate layer 110 will be described. However, it should be noted that the invention is not limited to only semiconductor (e.g., polysilicon) floating gate material.

The sacrificial layer 114 may be any insulating, semiconductor or conductor layer which can be selectively etched with respect to the insulating fill layer 104 and the conducting layer 112. For example, layer 114 may be an insulating layer, such as silicon nitride or an organic (e.g., polymer) sacrificial layer when layer 104 is silicon oxide and layer 112 is TiN.

The insulating fill material 104 fills the first gaps 102 to a level approximately equal to a top of the sacrificial layer 114. This structure may be made by any method known in the art. For example, layers 108, 110, 112 and 114 may be formed over the semiconductor layer 106 (e.g., semiconductor substrate or layer 106) and then patterned by photolithography and etching to form the rails 100 separated by the first gaps 102. The gaps may then be filled with the insulating fill material 104 by depositing the fill material 104 in the gaps followed by planarizing the material 104 even with the top of the rails 100 using CMP or etchback.

As shown in FIG. 1B, some or all of the sacrificial layer 114 is removed from the rails 100 by selective etching with respect to the fill material 104, thereby forming insulating fill rails 104A separated by second gaps 117, such that the electrically conducting layer 112 in the first rails 100 is exposed in the second gaps 117.

Then, as shown in FIG. 1C, a sacrificial spacer layer 116 is conformally deposited in the second gaps 117 over the insulating fill rails 104A. The spacer layer 116 is deposited conformally, such as by CVD, to be located on the sidewalls of the insulating fill rails 104A. The sacrificial spacer layer 116 may be any insulating, semiconductor or conductor layer which can be selectively etched with respect to the insulating fill rails 104A and the conducting layer 112. For example, layer 116 may be an insulating layer, such as silicon nitride sacrificial spacer layer when layer 104 is silicon oxide and layer 112 is TiN.

As shown in FIG. 1D, the sacrificial spacer layer 116 is aniostropically etched using a sidewall spacer etch to form sidewall spacers 118 on the insulating fill rails 104A, such that the sidewall spacers 118 reduce a width of the second gaps 117. The narrowed gaps are labeled 117A for clarity.

Figure 1E:
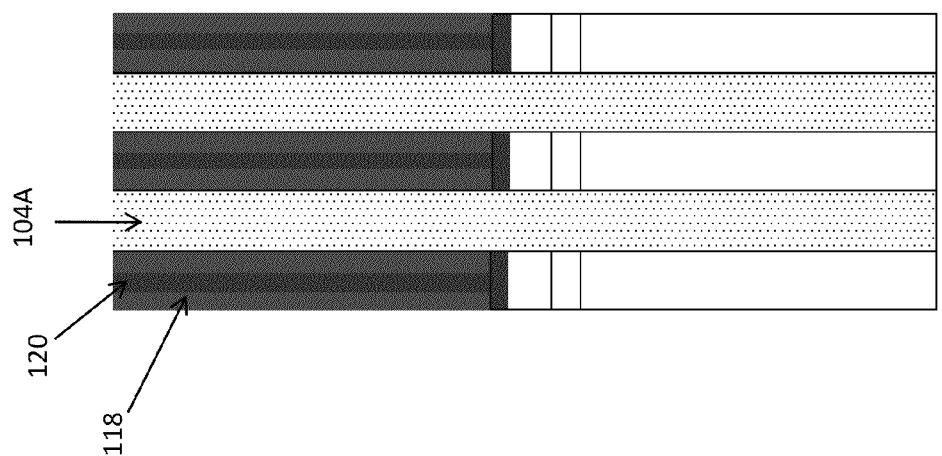

In the next step illustrated in FIG. 1E, a layer of electrically conducting material 120 may then be deposited in the second gaps 117A. The electrically conducting material 120 may comprise any suitable conducting material, such as titanium nitride ("TiN"), tantalum nitride ("TaN"), tantalum carbonitride ("TaCN"), tungsten nitride ("WN") or ruthenium ("Ru"). Material 120 is preferably the same as the material of layer 112. However, material 120 may be different from that of layer 112. Material 120 may be deposited by any suitable method, such as MOCVD, Atomic Layer Deposition (ALD), or sputtering, such that it fills the second gaps 117A located between the spacers 118. If material 120 extends above or is located the top of the spacers 118 and rails 104A, then material 120 may be planarized by CMP or another method to be level with the top of the spacers 118 and the rails 104A. The material 120 forms a plurality of electrically conducting fins 122. Each of the plurality of electrically conducting fins 122 is located in one of the respective second gaps 117A.

Each of the plurality of electrically conducting fins 122 is located over one of the plurality of polysilicon floating gate rails 110 and the plurality of electrically conducting fins comprise a material other than polysilicon. The fins 112 are elongated or rail shaped and together with the floating gate rails 110 they extend in and out of the page in FIGS. 1A-1E as part of the first rails 100. As illustrated, the fins 122 have a width (about equal to the width of the second gap 117A between the spacers 118) that is much smaller than their height. Preferably, the width of the fins 122 is one half or less than the width of the first rails 100 and the width of each fin 122 is preferably one half or less than the width of the second gap 117 prior to the formation of the spacers 118, as shown in FIG. 1B.

The insulating fill rails 104A and the sidewall spacers 118 are then removed by selective etching (e.g., using an etching liquid which selectively etches the material of the rails and the spacers compared to the material of the fins) thereby leaving the plurality of electrically conducting fins 122 spaced apart from each other by third gaps 123, as shown in FIG. 1F. Alternatively, the rails 104A and the spacers 118 may be removed by covering the top surface of the device with a photoresist layer (not shown), patterning the photoresist to mask the first conducting layer 120 while exposing the rails 104A and the spacers 118 and non-selectively etching the exposed rails 104A and the sidewall spacers 118.

Figure 1H:
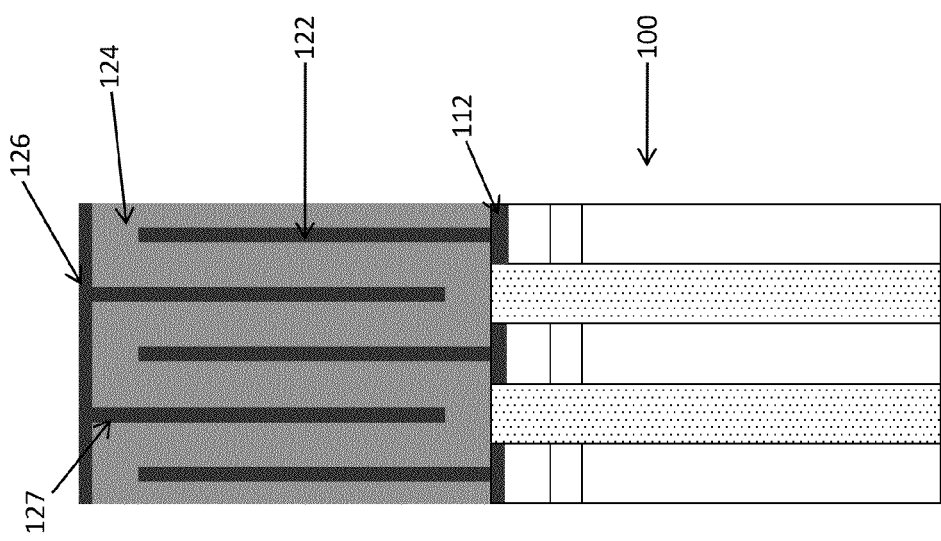
Figure 1G:
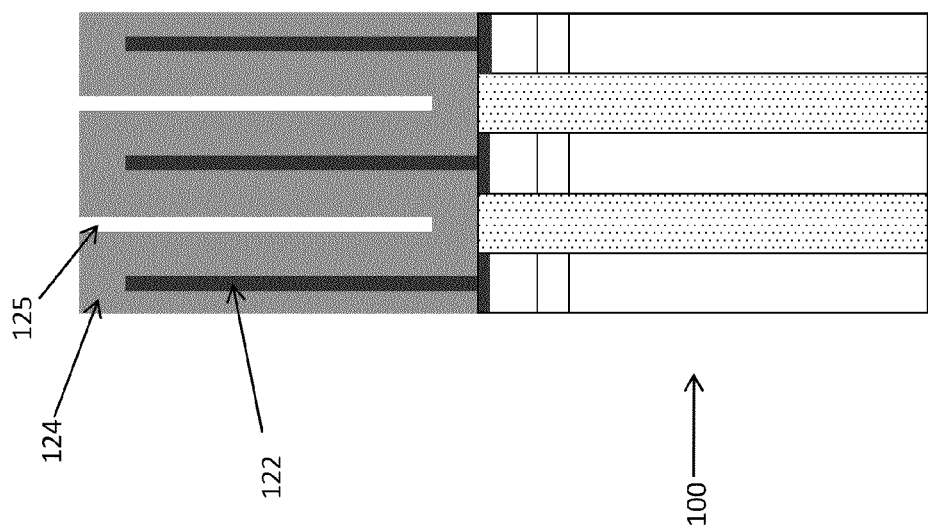

After forming the fins 122, a conformal dielectric blocking layer 124 may be deposited surrounding the fins 122, as shown in FIG. 1G. Layer 124 may comprise any one or more suitable insulating layers, such as silicon oxide, silicon nitride, silicon oxynitride, aluminum oxide, hafnium oxide, etc. For example, layer 124 may comprise ONO (oxide-nitride-oxide) sublayers. Preferably, the conformal dielectric blocking layer 124 is deposited to partially fill the third gaps 123 formed such that a narrowed, partially filled third gap 125 in blocking dielectric 124 is maintained between adjacent fins 122, as shown in FIG. 1G. The oxide and/or nitride layer(s) 124 may be deposited at a relatively low temperature, such as by atomic layer deposition (ALD) to avoid oxidizing the fins 122.

A third conductive layer 126 may then be deposited in the over the blocking dielectric layer 124, as shown in FIG. 1H. The electrically conducting layer 126 may comprise any suitable conducting material, such as titanium nitride ("TiN"), tantalum nitride ("TaN"), tantalum carbonitride ("TaCN"), tungsten nitride ("WN") or ruthenium ("Ru").

Portions of the third electrically conducting layer 126 fill a remaining space in the partially filled third gaps 125 in the conformal blocking dielectric layer 124. Portions of the third electrically conducting layer 126 in the gaps 125 form strip shaped portions 127 of at least one control gate, such that each pair of adjacent fins 122 is interdigitated with one of the strip shaped portions 127 of at least one control gate. As will be discussed in more detail below, the fins 122 and layer 112 comprise upper portions of the polysilicon floating gate rails 110 while the third conductive layer 126 (including the strip portions 127) comprises lower portions of NAND control gates.

Figure 2C:
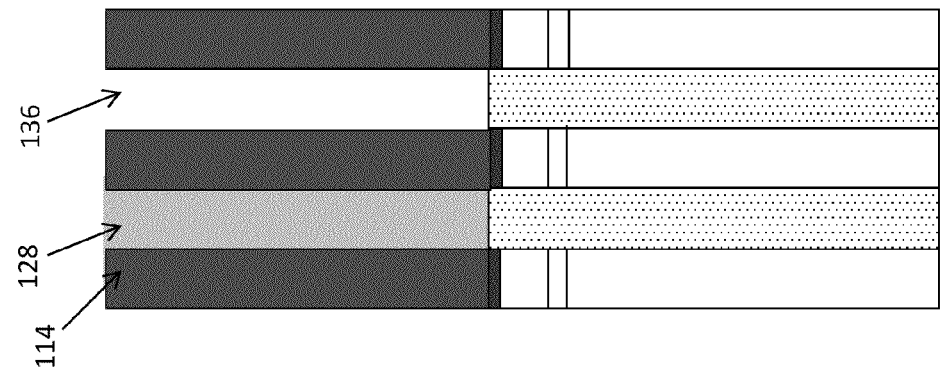
Figure 2B:
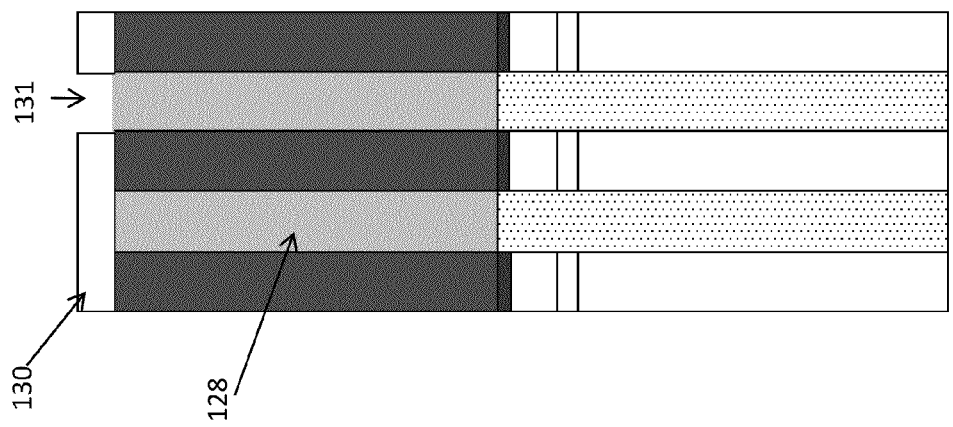
Figure 2A:
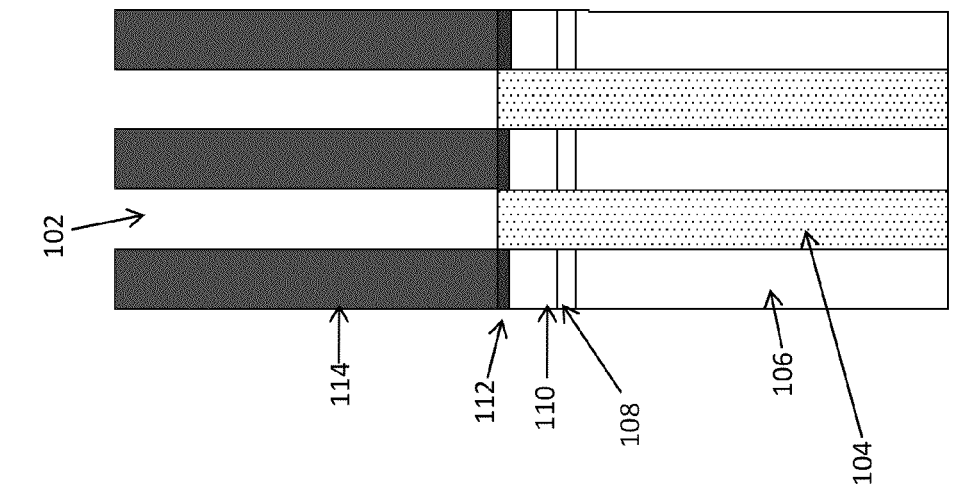

FIGS. 2A-2G illustrate steps in a second embodiment of a method of making the stacked metal fin cell. In this embodiment of the method, the first rails 100 are separated by first gaps 102 filled with a first insulating fill layer 104, as shown in FIG. 2A. The first rails 100 include the semiconductor active layer 106, the tunneling dielectric layer 108 over the semiconductor active layer 106, the floating gate layer 110 over the tunneling dielectric layer 108 and the sacrificial layer 114 over the floating gate layer 110. Optionally, the first rails 100 may also include the electrically conducting layer 112 over the floating gate layer and below the sacrificial layer 114, as in the first embodiment.

In this second embodiment, the first insulating fill layer 104 fills the first gaps 102 to a level approximately equal to the bottom of the sacrificial layer 114. A second insulating fill layer 128 is deposited in the first gaps 102 over the first insulating fill layer 104, as shown in FIG. 2B. Preferably, the second insulating fill layer material 128 is different from the first insulating fill layer material 104. For example, the first insulating fill layer 104 may be an oxide, such as $SiO_2$, while the second insulating fill layer 128 may be a borosilicate glass (e.g., BSG or BPSG). Other materials may be used for the first insulating fill layer 104 and the second insulating fill layer 128. Preferably, the second insulating fill material 128 fills the first gaps 102 to a level approximately equal to the top of the sacrificial layer 114.

The structure shown in FIG. 2A may be formed by providing the structure shown in FIG. 1A and selectively etching the first insulating fill layer 104 to recess layer 104 in the gaps 102. Thereafter, the second insulating fill layer 128 is deposited into the gaps 102 over layer 104. Optionally, layer 128 may be planarized by CMP to planarize the top surface of the device such that the second fill material 128 fills the first gaps to a level approximately equal to the top of the sacrificial layer 114.

The top surface of the device may be covered with a mask 130, such as a photoresist mask and/or a hard mask (e.g., silicon nitride, etc.), and patterned so that every other gap 102 is covered by the mask 130, as shown in FIG. 2B. In other words, if the even numbered gaps 102 are covered by the mask 130, then the odd numbered gaps 102 are exposed in the openings 131 in the mask 130 and vice-versa.

The device is then etched to remove the second insulating fill layer material 128 from every other gap 102 that is exposed in the openings 131 in the mask, as shown in FIG. 2C. This etching step forms second gaps 136 which correspond to every other (e.g., every odd or every even numbered) first gap 102. Preferably, the etched first gaps 102 are etched down to the top of the first insulating fill layer material 104. The mask 130 is then removed to leave the first insulating fill layer material 104 in every other (e.g., the other one of every even or every odd numbered) first gap 102.

Figure 2D:
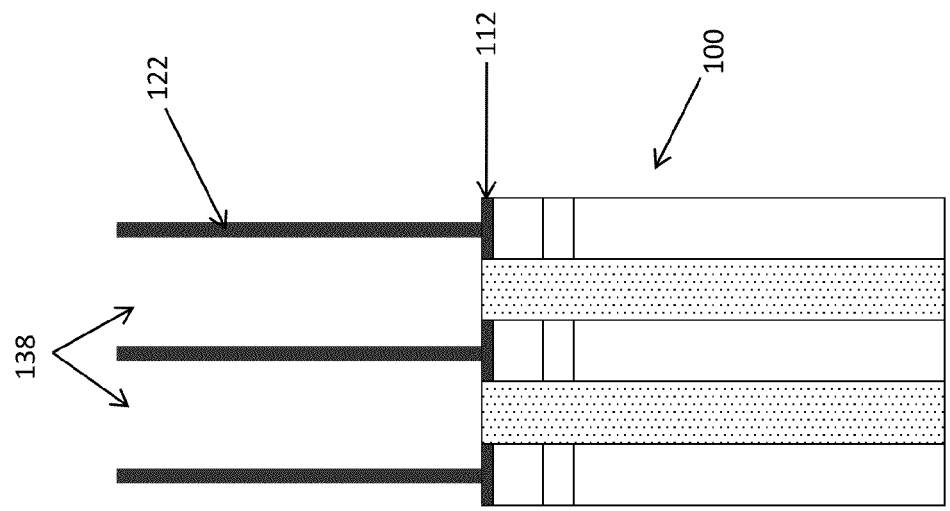

Next, the sacrificial layer 114 may be selectively recess etched, thereby widening the second gaps 136 and lowering the height of the sacrificial layer 114 adjacent the columns or rails of the second insulating fill layer material 128, as shown in FIG. 2D. The etching step may use any etching liquid (e.g., a wet isotropic etch) which can selectively etch sacrificial material 114 (e.g., silicon nitride) compared to the insulating material 128 (e.g., BSG or BPSG). Thus, a small portion of the sidewalls of the columns of the second insulating fill layer material 128 are exposed.

As further shown in FIG. 2D, a conformal layer of conducting material 120 is then deposited over the surface. The electrically conducting material 120 may comprise any suitable conducting material, such as titanium nitride ("TiN"), tantalum nitride ("TaN"), tantalum carbonitride ("TaCN"), tungsten nitride ("WN") or ruthenium ("Ru").

The conformal layer of conducting material 120 covers the bottom of the second gaps 136, the exposed sidewalls of the sacrificial layer 114, the top of the remaining sacrificial layer 114, and the top and the exposed portions of the sidewalls of the second insulating fill material 128.

Figure 2E:
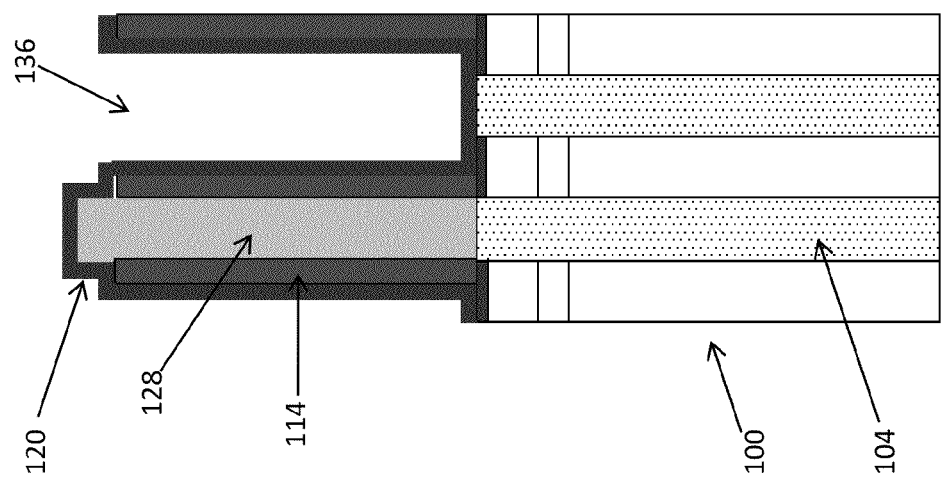

As illustrated in FIG. 2E, a sidewall spacer etch of the first conducting layer 120 is performed to remove the first conducting material 120 from the bottom of the second gaps 136 and the tops of the columns of second insulating fill material 128. This etch results in fin shaped sidewall spacers adjacent the sacrificial layer 114. To complete the fins 122, the columns of second insulating fill material 128 remaining in every other first gap 102 and the remaining sacrificial layer 114 are selectively etched or are lifted off. This results in a plurality of electrically conducting fins 122 over the second electrically conducting layer 112. The electrically conducting fins 122 are spaced apart by third gaps 138, as shown in FIG. 2E.

After forming the fins 122, the process proceeds similar to the first embodiment. A conformal dielectric blocking layer 124 may be deposited in the third gaps 138 surrounding the fins 122, as shown in FIG. 2F. Layer 124 may comprise any one or more suitable insulating layers, such as silicon oxide, silicon nitride, silicon oxynitride, aluminum oxide, hafnium oxide, etc. Preferably, the conformal dielectric blocking layer 124 is deposited to partially fill the third gaps 138 such that a narrowed, partially filled third gap 125 in blocking dielectric 124 is maintained between adjacent fins 122, as shown in FIG. 2F.

A third conductive layer 126 may then be deposited in the over the blocking dielectric layer 124, as shown in FIG. 2G. The electrically conducting layer 126 may comprise any suitable conducting material, such as titanium nitride ("TiN"), tantalum nitride ("TaN"), tantalum carbonitride ("TaCN"), tungsten nitride ("WN") or ruthenium ("Ru").

Portions of the third electrically conducting layer 126 fill a remaining space in the partially filled third gaps 125 in the conformal blocking dielectric layer 124. Portions of the third electrically conducting layer 126 in the gaps 125 form strip shaped portions 127 of at least one control gate, such that each pair of adjacent fins 122 is interdigitated with one of the strip shaped portions 127 of at least one control gate. As will be discussed in more detail below, the fins 122 comprise upper portions of the polysilicon floating gate rails 110 while the third conductive layer 126 (including the strip portions 127) comprises lower portions of NAND control gates.

In the embodiments illustrated in FIGS. 1 and 2, the fins 122 may be made of any hard, electrically conductive material other than polysilicon, for example, TiN, TaN, TaCN, WN or Ru. That is, the first conducting layer 120 may be TiN, TaN, TaCN, WN or Ru while the floating gate rails 110 may be made of polysilicon.

A fin 122 has a length extending in a direction from a source 146 to a drain 148 (which are shown in FIG. 4, and the source to drain direction in FIGS. 1F and 2E is into the page), a width perpendicular to the length (left to right direction in FIGS. 1F and 2E), and a height in a direction normal to a major surface of a substrate (e.g., 106 or another substrate) supporting the NAND device (the vertical direction in FIGS. 1F and 2E). In an embodiment, the fins 122 may have a width of 3-5 nanometers and a height of less than or equal to 120 nm, such as 25-120 nanometers. Preferably, the ratio of the height to the width of the fins 122 is in the range of 5-30:1, such as 12:1.

In other words, at least a portion of the fin 122 has a minor surface (i.e., short side) parallel to a minor surface of the first rails 100, and a major surface (i.e., long side) perpendicular to the minor surface of the first rails (as shown in FIG. 3). A width of the minor surface of the fin 122 is approximately one half or less than a width of the minor surface of the first rails 100. A ratio of the height to the width of the minor surface of the fin is 5-30:1.

In an embodiment, the second conducting layer 112 and the fins 122 are made of the same material. However, these conductive materials may be different if desired. The floating gate rails 110 may have a height of 1-20 nm and a width of 6-20 nm.

As discussed above, the structures illustrated in FIGS. 1H and 2G may be further processed to form a NAND nonvolatile memory device 300 shown in FIGS. 3 and 4. FIG. 3 shows a three dimensional cross sectional view of a portion of the NAND device containing NAND cells 300A, 300B and 300C. FIG. 4 shows a side cross sectional view of one NAND cell 300C that appears in face 4 of the device 300 shown in FIG. 3. The portion of NAND cell 300C shown in FIG. 3 is set off by imaginary lines 3 and 3' in FIG. 4.

To make the NAND device 300, an optional fourth electrically conducting layer 140 is deposited over the third electrically conducting layer 126, as shown in FIG. 2H. Layer 140 may comprise any suitable conductive layer that may be used in a control gate, such as tungsten or polysilicon.

The device is then patterned to form second rails 142 extending substantially perpendicular to the first rails 100, as shown in FIGS. 3 and 4. The second rails 142 include the patterned fourth electrically conducting layer 140, the third electrically conducting layer 126 (including the strip shaped portions 127), the blocking dielectric layer 124, the plurality of electrically conducting fins 122, the second electrically conducting layer 112 and the floating gates 110A. This patterning step separates the floating gate layer rails 110 into separate, block shaped floating gates, such as cube or hexahedron shaped gates 110A, and separates the elongated rails shaped fins into thin plate shaped fins 122. The rails 142 are separated by fourth gaps 144.

The rail 142 patterning may be carried out by forming an optional hard mask (e.g., silicon nitride) and advanced patterning film ("APF") e.g., amorphous carbon) over layer 140, followed by forming a photoresist layer. The photoresist layer is then photolithographically patterned into rail shaped mask patterns and is used to etch the underlying layers. The underlying layers, such as the hard mask/APF, fourth electrically conducting layer 140, the third electrically conducting layer 126 (including the strip shaped portions 127), the blocking dielectric layer 124, the plurality of electrically conducting fins 122, the second electrically conducting layer 112 may be dry etched, using the floating gate layer 110 as an etch stop. The floating gate layer 110 is then dry and/or wet etched using polysilicon etching chemistry. The etch stops on the tunneling dielectric layer 108.

During the rail 142 patterning, layers 140 and 126 are patterned to form a plurality of rail shaped control gates 152 as shown in FIGS. 3 and 4 (only one gate 152 is shown in FIG. 3 for clarity). Each rail shaped control gate 152 includes a portion of layers 126 and 140 and the strip shaped 127 portions which extend downward from the rail shaped control gate. Each of the plurality of control gates 152 is located adjacent to each of the plurality of floating gates 110A and each of the plurality of electrically conducting fins 122. Preferably, the fins 122 (which are electrically connected to the floating gates 110A by layer 112) are interdigitated with the strip shaped 127 portions of the control gate 152. In other words, each strip 127 extends downward from one of the plurality of the control gate rails 152 between the pair of adjacent electrically conducting fins 122 from adjacent NAND cells (e.g., fin 122A from cell 300A and fin 122B from cell 300B), as shown in FIG. 3. The blocking dielectric is located between strips 127 and the adjacent fins 122.

The rails 142 may be further processed to form an optional insulating liner (e.g., silicon oxide or nitride) on the sidewalls of the rails in gaps 144 followed by forming sidewall spacers 156, such as silicon oxide or nitride spacers, on control gates 152. An insulating fill material 154, such as BSG or BPSG, may be formed between the rails 142, as shown in FIG. 4. Alternatively, the gaps 144 may remain unfilled for air gap dielectric isolation (i.e., a void separates adjacent rails 142).

After forming the second rails 142, the semiconductor active layer 106 of each NAND cell (e.g., 300C) is optionally doped to form optional source 146 and drain 148 regions, such that a NAND channel 150 is located in the semiconductor active layer 106 between the source 146 and drain 148 regions, as shown in FIG. 4.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A NAND device comprising:
   a source, a drain and a channel located between the source and drain;
   a plurality of floating gates located over the channel;
   a plurality of electrically conducting fins, wherein each of the plurality of electrically conducting fins is located over one of the plurality of floating gates, the plurality of electrically conducting fins comprising a material other than polysilicon; and
   a plurality of control gates, wherein each of the plurality of control gates is located adjacent to each of the plurality of floating gates and each of the plurality of electrically conducting fins;
   wherein:
   each pair of adjacent fins is interdigitated with at least a first portion of one of the plurality of control gates;
   the plurality of electrically conducting fins extend upward from the plurality of floating gates;
   the plurality of control gates comprise a plurality of control gate rails;
   each of the plurality of control gate rails have a plurality of electrically conducting first portions; and
   each of the plurality of electrically conducting first portions comprises a strip which extends downward from one of the plurality of the control gate rails between the pair of adjacent electrically conducting fins.

2. The device of claim 1, further comprising a blocking dielectric layer located between the plurality of electrically conducting fins and the plurality of electrically conducting first portions of the control gates, and a tunneling dielectric layer located between each of the plurality of floating gates and the channel.

3. The device of claim 1, wherein the plurality of electrically conducting fins comprise TiN, TaN, TaCN, WN, or Ru and the plurality of floating gates comprise polysilicon, TiN, TaN, TaCN, or WN.

4. The device of claim 1, wherein:
   each of the plurality of electrically conducting fins has a length extending in a direction from the source to the drain, a width perpendicular to the length, and a height in a direction normal to a major surface of a substrate supporting the NAND device;
   the width is 3-5 nanometers;
   the height is 25-120 nanometers; and
   a ratio of the height to the width is 5-30:1.

5. The device of claim 1, further comprising an electrically conducting layer between each respective one of the plurality of floating gates and one of the plurality of electrically conducting fins, wherein the electrically conducting layer and the electrically conducting fins comprise the same material.

6. The device of claim 1, wherein the plurality of control gates further comprise insulating sidewall spacers and the NAND device further comprises an insulating fill layer or void between the insulating sidewall spacers.

* * * * *